United States Patent
Li et al.

(10) Patent No.: US 9,449,709 B1
(45) Date of Patent: Sep. 20, 2016

(54) VOLATILE MEMORY AND ONE-TIME PROGRAM (OTP) COMPATIBLE MEMORY CELL AND PROGRAMMING METHOD

(71) Applicant: QUALCOMM Incorporated, San Diego, CA (US)

(72) Inventors: Xia Li, San Diego, CA (US); Xiaonan Chen, San Diego, CA (US); Niladri Narayan Mojumder, San Diego, CA (US); Zhongze Wang, San Diego, CA (US); Weidan Li, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/863,417

(22) Filed: Sep. 23, 2015

(51) Int. Cl.
  *G11C 11/00* (2006.01)
  *G11C 17/18* (2006.01)
  *G11C 11/419* (2006.01)
  *G11C 17/16* (2006.01)

(52) U.S. Cl.
  CPC ............ *G11C 17/18* (2013.01); *G11C 11/419* (2013.01); *G11C 17/16* (2013.01)

(58) Field of Classification Search
  CPC .......................................... G11C 11/41–11/419
  USPC .................................................. 365/154, 149
  See application file for complete search history.

(56) References Cited

U.S. PATENT DOCUMENTS

| | | | |
|---|---|---|---|
| 4,618,943 A | 10/1986 | Aipperspach et al. | |
| 6,768,669 B2 | 7/2004 | Schmidt et al. | |
| 7,301,797 B2 | 11/2007 | Kimura | |
| 7,760,537 B2 | 7/2010 | Urakawa | |
| 7,920,411 B2 | 4/2011 | Chang et al. | |
| 2008/0144365 A1* | 6/2008 | Yamaoka | G11C 11/417 365/181 |
| 2010/0177556 A1* | 7/2010 | Chen | G11C 11/412 365/156 |
| 2012/0140564 A1* | 6/2012 | Liu | G11C 16/0441 365/185.18 |

* cited by examiner

*Primary Examiner* — Han Yang
(74) *Attorney, Agent, or Firm* — Seyfarth Shaw LLP

(57) ABSTRACT

A volatile and one-time program (OTP) compatible asymmetric memory cell may include a first pull-up transistor having a first threshold voltage. The asymmetric memory cell may also include a second pull-up transistor having a second threshold voltage that differs from the first threshold voltage. The asymmetric memory cell may further include a switch coupled to a well of the first pull-up transistor and the second pull-up transistor to alternate between a program voltage (Vpg) and a power supply voltage. The asymmetric memory cell may also include a peripheral switching circuit to control programming of the asymmetric memory cell.

20 Claims, 17 Drawing Sheets

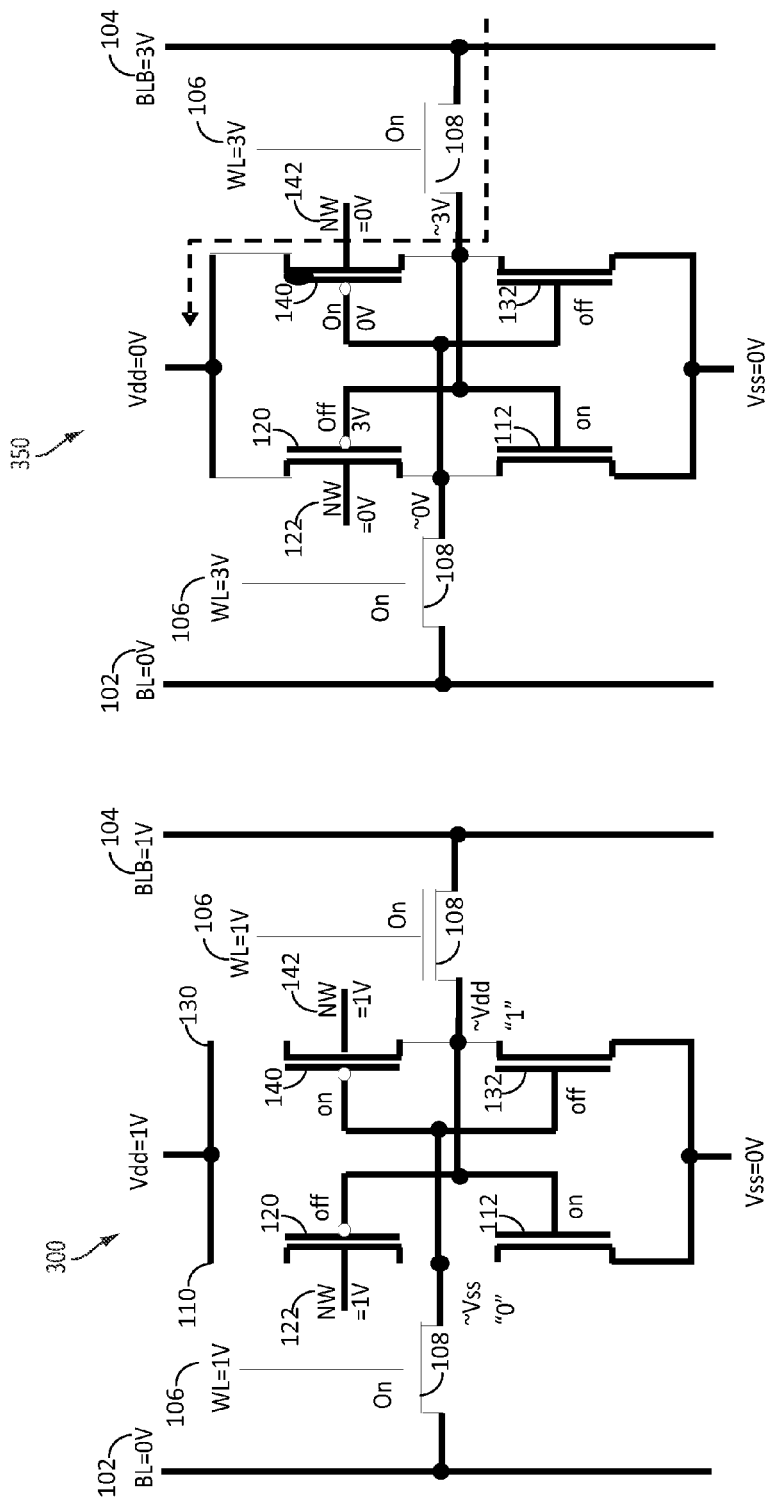

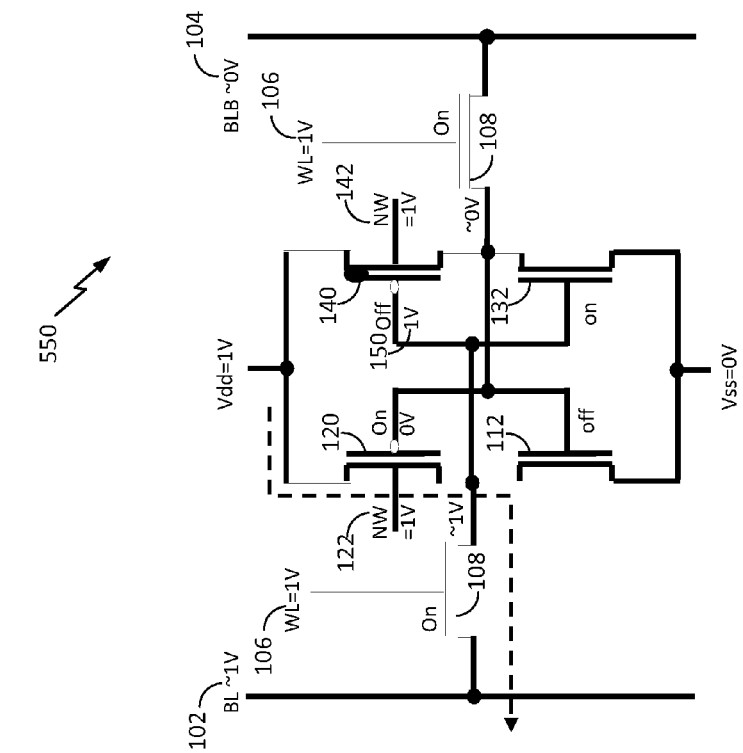
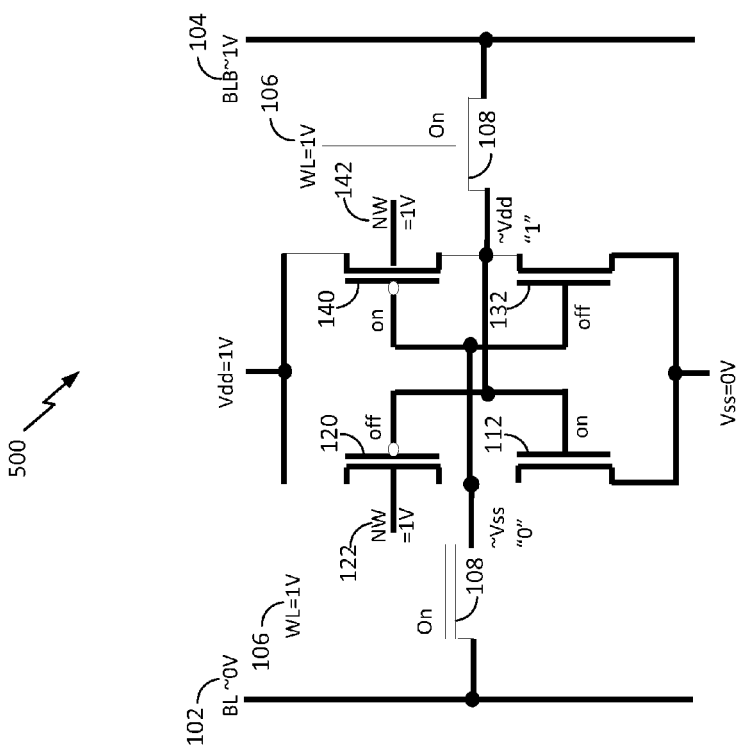
FIG. 5B
FIG. 5A

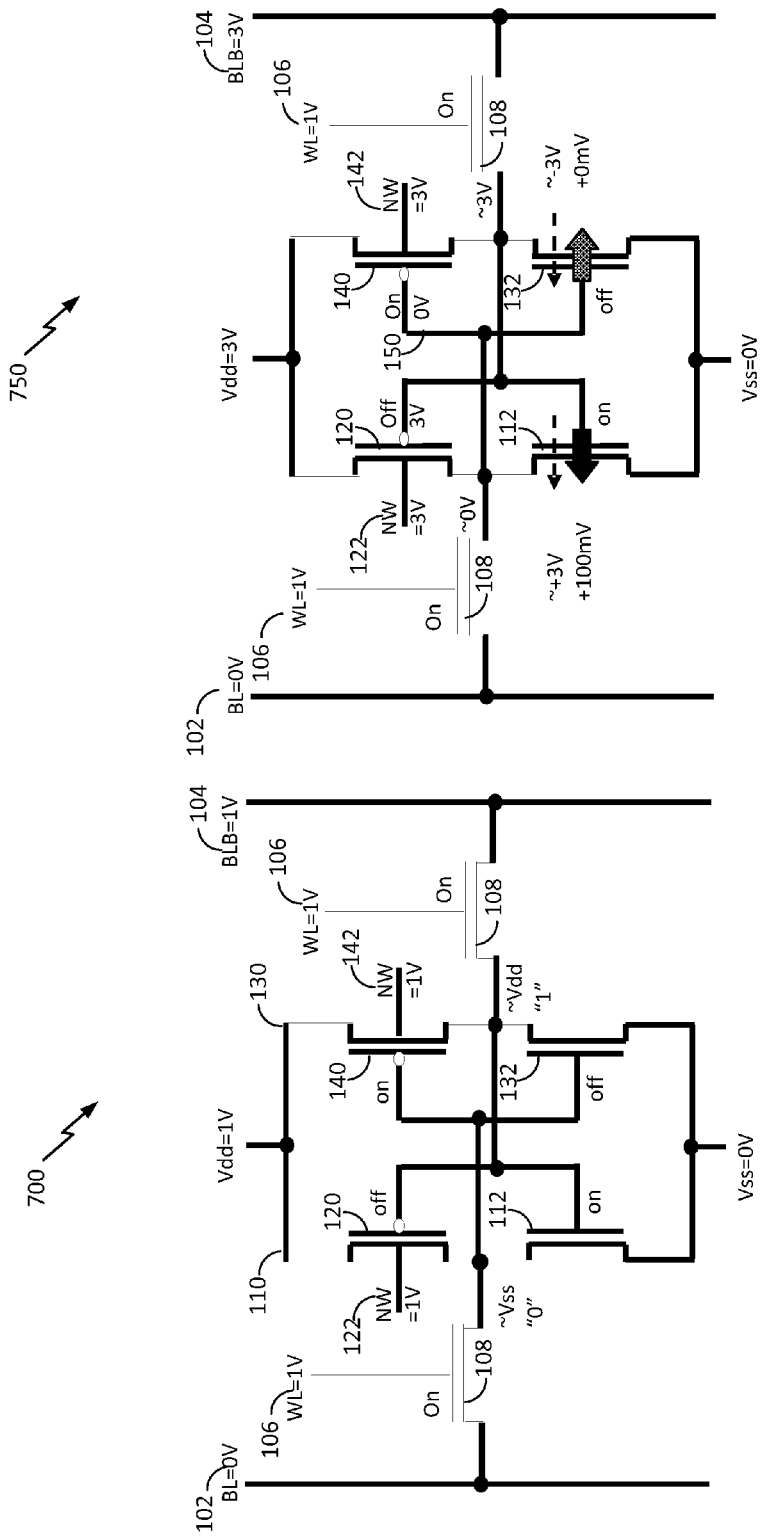

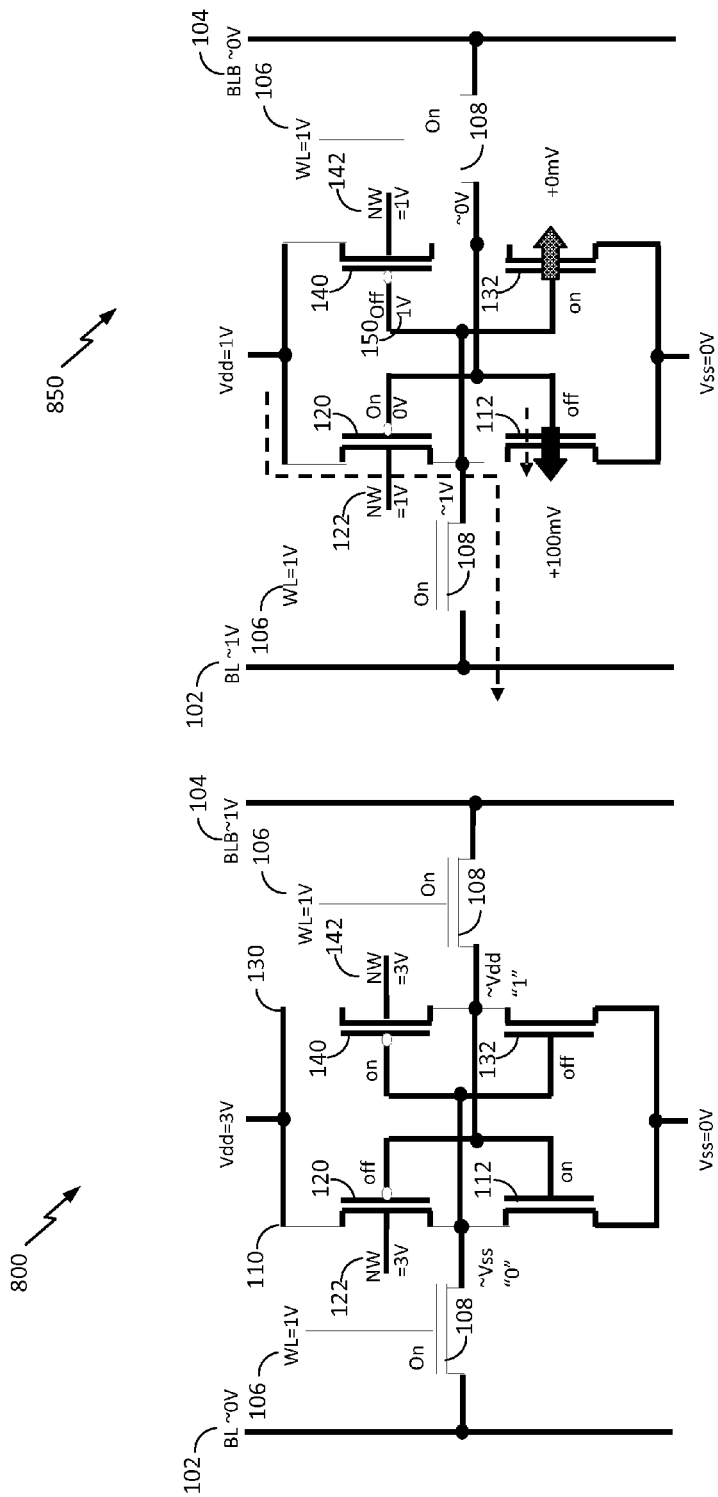

VOLATILE MEMORY AND ONE-TIME PROGRAM (OTP) COMPATIBLE MEMORY CELL AND PROGRAMMING METHOD

BACKGROUND

1. Field

The present disclosure generally relates to integrated circuits (ICs). More specifically, aspects of the present disclosure relate to a volatile memory and a one-time program (OTP) compatible memory cell and programming method.

2. Background

Semiconductor memory devices include, for example, a static random access memory (SRAM) and a dynamic random access memory (DRAM). A DRAM memory cell generally includes one transistor and one capacitor, thereby providing a high degree of integration. DRAM, however, uses constant refreshing, which limits the use of DRAM to computer main memory. An SRAM cell, by contrast, is bi-stable, meaning that it can maintain its state indefinitely, so long as adequate power is supplied. SRAM also supports high speed operation, with lower power dissipation, which is useful for computer cache memory.

One example of an SRAM cell is a six transistor (6T) SRAM cell that includes six metal-oxide-semiconductor (MOS) transistors. The core of an SRAM cell may be formed by using two cross-coupled inverters. The two inverters are connected using a feedback loop in which the output potential of each inverter (e.g., Vout) is fed as input to the other inverter (e.g., Vin). The cross-coupling of the inverters using the feedback loop stabilizes the inverters to their respective state.

One advantage of SRAM cells is their ability to handle external direct current (DC) noise. The capability of an SRAM cell to handle external DC noise is based on the static noise margin (SNM) of the SRAM cell. The SNM of an SRAM cell is determined by nesting the largest possible square in the two voltage transfer curves (VTC) of the inverters. The SNM of the SRAM cell may be defined as the side-length arranged between the VTCs of the inverters. Unfortunately, when external DC noise exceeds the SNM of an SRAM cell, the state of the SRAM cell changes, resulting in a loss of the stored data.

SUMMARY

A volatile and one-time program (OTP) compatible asymmetric memory cell may include a first pull-up transistor having a first threshold voltage. The asymmetric memory cell may also include a second pull-up transistor having a second threshold voltage that differs from the first threshold voltage. The asymmetric memory cell may further include a switch coupled to a well of the first pull-up transistor and the second pull-up transistor to alternate between a program voltage (Vpg) and a power supply voltage. The asymmetric memory cell may also include a peripheral switching circuit to control programming of the asymmetric memory cell.

A method for a volatile and one-time program (OTP) compatible asymmetric memory cell may include writing a zero state or a one state to the asymmetric memory cell. The method may also include setting a well of a first pull-up device and a second pull-up device of the asymmetric memory cell to a program voltage (Vpg) and setting a power supply voltage to zero to permanently alter a threshold voltage of a selected one of the first pull-up device and the second pull-up device. The method further includes applying a reduced power supply voltage (Vdip) to load an OTP state within the asymmetric memory cell.

A volatile and one-time program (OTP) compatible asymmetric memory cell may include a first pull-up transistor having a first threshold voltage. The asymmetric memory cell may also include a second pull-up transistor having a second threshold voltage that differs from the first threshold voltage. The asymmetric memory cell may further include a switch coupled to a well of the first pull-up transistor and the second pull-up transistor to alternate between a program voltage (Vpg) and a power supply voltage. The asymmetric memory cell may also include means for controlling programming of the asymmetric memory cell.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily used as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of aspects of the present disclosure, reference is now made to the following description taken in conjunction with the accompanying drawings.

FIG. 3A is a circuit diagram of an asymmetric memory cell for programming a zero state and presetting the asymmetric memory cell for one-time program (OTP) operation in accordance with aspects of the present disclosure.

FIG. 3B is a circuit diagram illustrating programming of an asymmetric memory cell to permanently alter the threshold voltage of a selected pull-up device for OTP operation in accordance with aspects of the present disclosure.

FIG. 5A is a circuit diagram of an asymmetric memory cell for programming a zero state and presetting an OTP one state read operation of the asymmetric memory cell in accordance with aspects of the present disclosure.

FIG. 5B is a circuit diagram illustrating reading of an OTP one state from an asymmetric memory cell in accordance with aspects of the present disclosure.

FIG. 7A is a circuit diagram of an asymmetric memory cell for programming a zero state and presetting the asymmetric memory cell for multi time program (MTP) operation in accordance with aspects of the present disclosure.

FIG. 7B is a circuit diagram illustrating programming of an asymmetric memory cell to permanently alter the threshold voltage of a selected pull down device for MTP operation in accordance with aspects of the present disclosure.

FIG. 8A is a circuit diagram of an asymmetric memory cell for programming a zero state and presetting an MTP one state read operation for the asymmetric memory cell in accordance with aspects of the present disclosure.

FIG. 8B is a circuit diagram illustrating an MTP one state cell read operation of an asymmetric memory cell in accordance with aspects of the present disclosure.

DETAILED DESCRIPTION

Figure 1A:
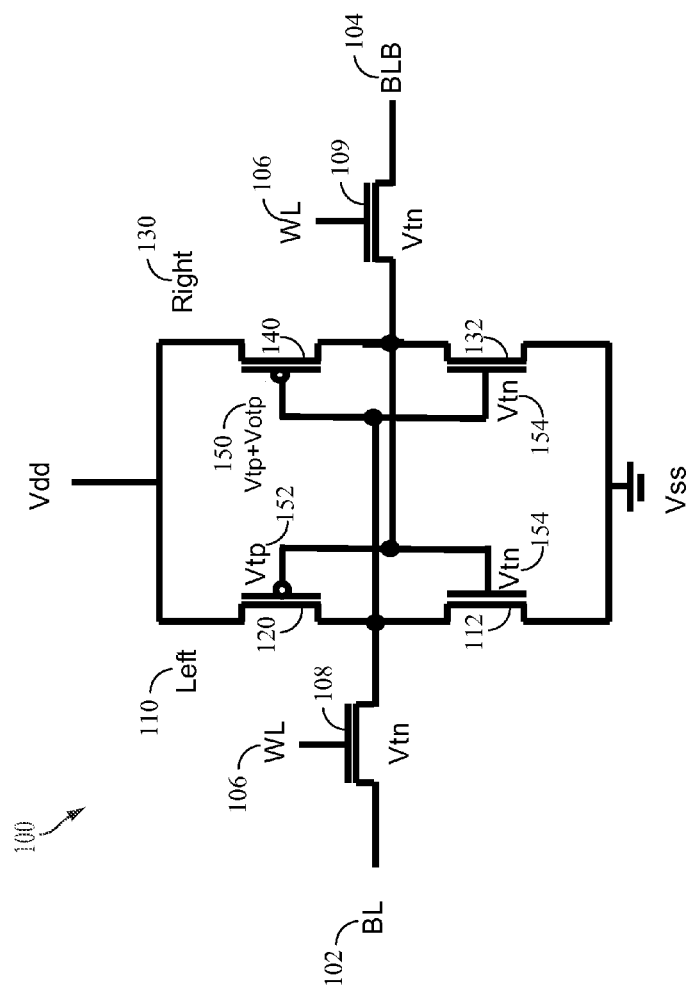
FIGS. 1A and 1C are circuit diagrams of an asymmetric memory cell that supports both volatile storage operation and one-time programmable (OTP) storage operation in accordance with aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Semiconductor memory devices include, for example, a static random access memory (SRAM) and a dynamic random access memory (DRAM). A DRAM memory cell generally includes one transistor and one capacitor, thereby providing a high degree of integration. DRAM, however, uses constant refreshing, which limits the use of DRAM to computer main memory. An SRAM cell, by contrast, is bi-stable, meaning that it can maintain its state indefinitely, so long as adequate power is supplied. SRAM also supports high speed operation, with lower power dissipation, which is useful for computer cache memory.

One example of an SRAM cell is a six transistor (6T) SRAM cell that includes six metal-oxide-semiconductor (MOS) transistors. The core of an SRAM cell may be formed by using two cross-coupled inverters. The two inverters are connected using a feedback loop in which the output potential of each inverter (e.g., Vout) is fed as input to the other inverter (e.g., Vin). The cross-coupling of the inverters using the feedback loop stabilizes the inverters to their respective state.

One advantage of SRAM cells is their ability to handle external direct current (DC) noise. The capability of an SRAM cell to handle external DC noise is based on the static noise margin (SNM) of the SRAM cell. The SNM of an SRAM cell is determined by nesting the largest possible square in the two voltage transfer curves (VTC) of the inverters. The SNM of the SRAM cell may be defined as the side-length arranged between the VTCs of the inverters. Unfortunately, when an external DC noise exceeds the SNM of an SRAM cell, the state of the SRAM cell changes, resulting in a loss of the stored data.

In contrast to an SRAM cell, which uses a constant supply of adequate power to maintain a state, a non-volatile memory (NVM) can maintain a state without a constant supply of power. NVMs may include memory cells as basic switching elements to store data. A one-time programmable (OTP) NVM is a form of digital memory, and a set value of each bit is locked by a fuse or anti-fuse. In an OTP memory, the set value of each bit cell cannot be reset. By contrast, in a multiple-time programmable (MTP) memory, a number of write cycles can be supported, versus the OTP memory in which data is permanently stored and cannot be changed.

Once programmed with data, a value of the data stored within an OTP memory cell may be determined by using a sense amplifier (SA) that uses a reference value to determine the data value of the stored data. Weak programming of an OTP memory cell, however, may reduce a threshold voltage (Vt) shift as well as a window (e.g., gap) between the data and the reference value. The reduced gap may involve the use of a compliment sense amplifier circuit or a differential sense amplifier circuit. Providing a compliment or differential sense amplifier circuit may involve the creation of a new platform to compensate for the reduced window to determine the data value of the stored OTP data.

Aspects of the disclosure relate to both volatile storage operation mode and OTP storage operation mode within asymmetric memory cells of the same memory array platform. The asymmetric memory cells of the memory array platform also support a multi time program (MTP) storage operation mode. A volatile memory device can be programmed to operate in an OTP mode with an increased threshold voltage (Vt) by applying a program condition using a peripheral switching circuit during a program mode. An SRAM cell includes a first pull-up device (e.g., a left pull-up device) and a second pull-up device (e.g., a right pull-up device) that are cross-coupled to store a state value. Aspects of the present disclosure program either the left pull-up device or the right pull-up device to permanently provide a threshold voltage mismatch between a first threshold voltage of the left pull-up device and a second threshold voltage of the right pull-up device. The permanent threshold voltage mismatch between the left pull-up device and the right pull-up device enables formation of a complementary OTP cell.

In operation, the threshold voltage mismatch between the left pull-up device and the right pull-up device enables the memory cell to remain in a program state when Vdd is applied. In addition, an SRAM sensing circuit may be used to sense whether the memory cell is in an SRAM state or an OTP state. Aspects of the disclosure enable an SRAM/OTP alternative design in which the SRAM array can provide SRAM (volatile) operation or OTP operation by field programming to provide the permanent threshold voltage mismatch between the left pull-up device and the right pull-up device at no additional cost.

FIG. 1A is a circuit diagram of an asymmetric memory cell 100 that supports both volatile storage operation and OTP storage operation in accordance with aspects of the present disclosure. Representatively, the asymmetric memory cell 100 may be an SRAM cell in which the core of the asymmetric memory cell 100 is formed by using two cross-coupled inverters. A left branch inverter 110 includes a left pull-down device 112 (e.g., n-type) and a left pull-up device 120 (e.g., p-type). A right branch inverter 130 includes a right pull-down device 132 (e.g., n-type) and a right pull-up device 140 (e.g., p-type). The left branch inverter 110 and the right branch inverter 130 are connected using a feedback loop in which the output potential of each inverter (e.g., Vout) is fed as input to the other inverter (e.g., Vin). The cross-coupling of the inverters using the feedback loop stabilizes the left branch inverter 110 and the right branch inverter 130 to their respective state.

The asymmetric memory cell 100 includes a left access transistor 108 that couples a word line 106 (WL) and a bit line (BL) 102 to the left branch inverter 110. The asymmetric memory cell 100 also includes a right access transistor 109 that couples the word line 106 (WL) and a bit line bar (BLB) 104. The access transistors (e.g., 108 and 109), the word lines (e.g., 106) and the bit lines (e.g., 102 and 104) may be used to read and write data to or from the asymmetric memory cell 100. Writing information to the asymmetric memory cell 100 includes loading the data on the bit line 102 and the inverse of the data on the bit line bar 104. Once loaded, the left access transistor 108 and right access transistor 109 are activated by asserting the word line 106 to store the data within the asymmetric memory cell 100. Once stored, the left access transistor 108 and right access transistor 109 are deactivated to preserve the stored data. Reading information from the asymmetric memory cell 100 includes activating the left access transistor 108 and right access transistor 109 and sensing the data on the bit line 102 and the bit line bar 104.

For the configuration shown in FIG. 1A, the left pull-down device 112 and the right pull-down device 132 are symmetric because the devices have matching threshold voltages 154 (e.g., Vtn). According to the present disclosure, the left pull-up device 120 (e.g., a first pull-up transistor) and the right pull-up device 140 (e.g., a second pull-up transistor) are asymmetric because the devices have mismatched threshold voltages. In particular, the left pull-up device 120 has a threshold voltage 152 (e.g., Vtp), whereas the right pull-up device 140 has an OTP threshold voltage 150 (e.g., Vtp+Votp). The mismatched threshold voltages between the left pull-up device 120 and the right pull-up device 140 enable both a volatile operation mode and an OTP operation mode within the asymmetric memory cell 100.

Figure 1B:
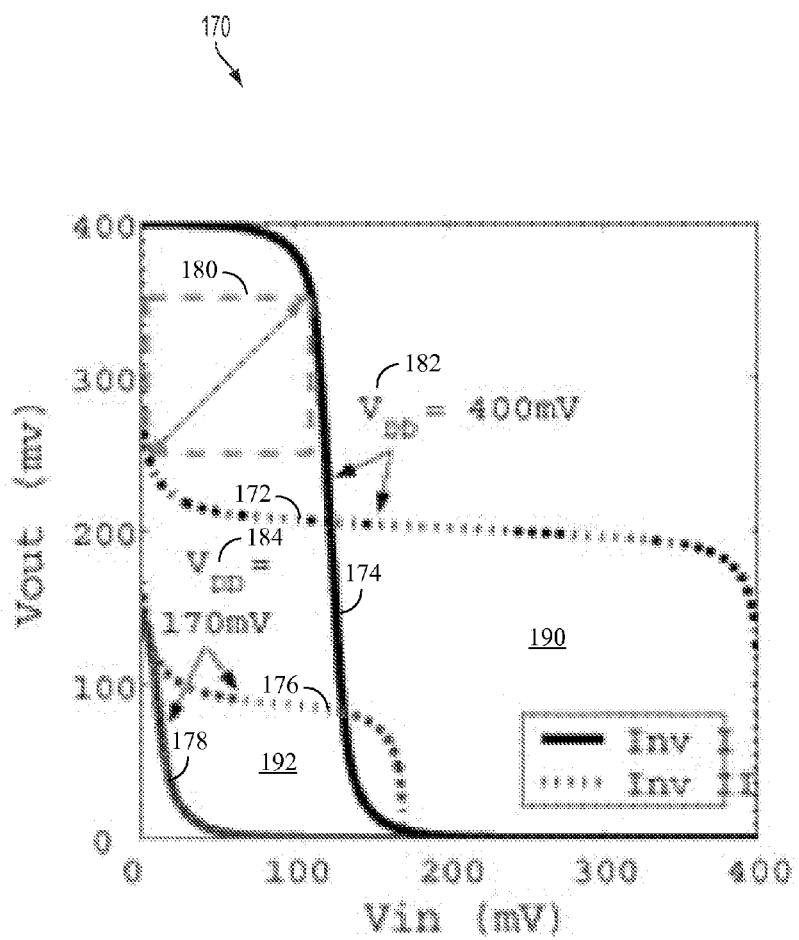
FIG. 1B is a graph illustrating voltage transfer curves of the asymmetric memory cell of FIG. 1A according to aspects of the disclosure.

FIG. 1B is a graph 170, illustrating voltage transfer curves of the asymmetric memory cell 100 of FIG. 1A, according to aspects of the disclosure. The capability of the asymmetric memory cell 100 to handle external DC noise is based on a static noise margin (SNM) of the asymmetric memory cell 100. In this aspect of the disclosure, the asymmetric memory cell 100 exhibits a left SNM 180 that is less than a right SNM 190 of the asymmetric memory cell 100 due to the threshold voltage mismatch. The left SNM 180 and the right SNM 190 are determined by nesting the largest possible square (e.g., the left SNM 180) in the two voltage transfer curves (VTC) (e.g., 172 and 174) of the left branch inverter 110 and the right branch inverter 130 for a power supply voltage 182 (e.g., Vdd=400 mV).

In aspects of the disclosure, purposely mismatching the threshold voltages of the left pull-up device 120 and the right pull-up device 140 provides the asymmetric memory cell with asymmetric static noise margins in which the right SNM 190 of the asymmetric memory cell 100 is substantially larger than the left SNM 180. In this aspect of the disclosure, with a reduced power supply voltage 184 (e.g., Vdip=170 mV), the left SNM 180 is reduced to zero within the VTCs (e.g., 176 and 178), resulting in a loss of the stored data within the left branch inverter 110. By contrast, although the right SNM 190 is also contracted to a reduced SNM 192, the stored data within the right branch inverter 130 is maintained due to the OTP threshold voltage 150 of the right pull-up device 140. The reduced power supply voltage 172 (e.g., Vdip) provides the reduced SNM 192 that is sufficient to store OTP data. When the power supply voltage is increased (e.g., Vdd=400 mV), the stored data within the right branch inverter 130 is retained due to the right SNM 190, whereas the stored data in the left branch inverter 110 is lost due to the left SNM 180 being smaller than the right SNM 190.

Figure 1C:
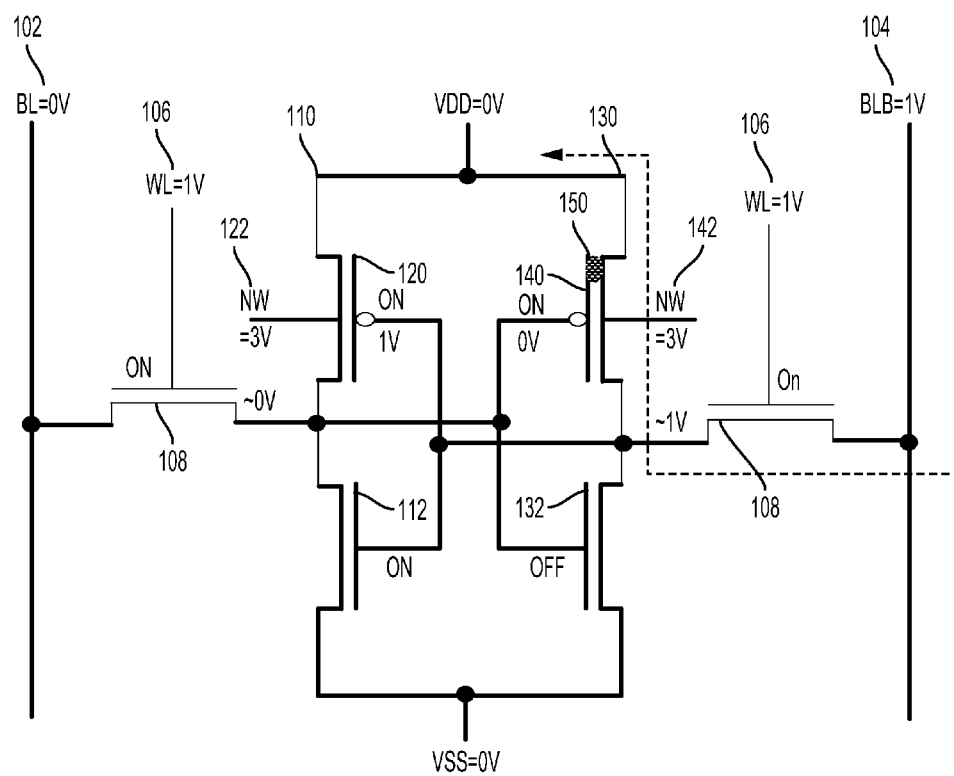

FIG. 1C is a circuit diagram further illustrating the asymmetric memory cell 100 of FIG. 1A according to an OTP storage operation mode in accordance with aspects of the present disclosure. Representatively, an n-well voltage 142 of the left pull-up device 120 and the right pull-up device 140 are set to a program voltage (e.g., Vpg=3V) using a switch (e.g., switch 230 of FIGS. 2A and 2B) while the power supply voltage is set to zero (e.g., Vdd=0). The threshold voltage mismatch between the left pull-up device 120 and the right pull-up device 140 results in a threshold voltage shift (e.g., 300 mV), such that the asymmetric memory cell 100 retains the OTP data according to a non-volatile state. That is, the stored data within the right branch inverter 130 is maintained due to the OTP threshold voltage 150 of the right pull-up device 140, as shown in FIG. 1A.

Figure 2A:
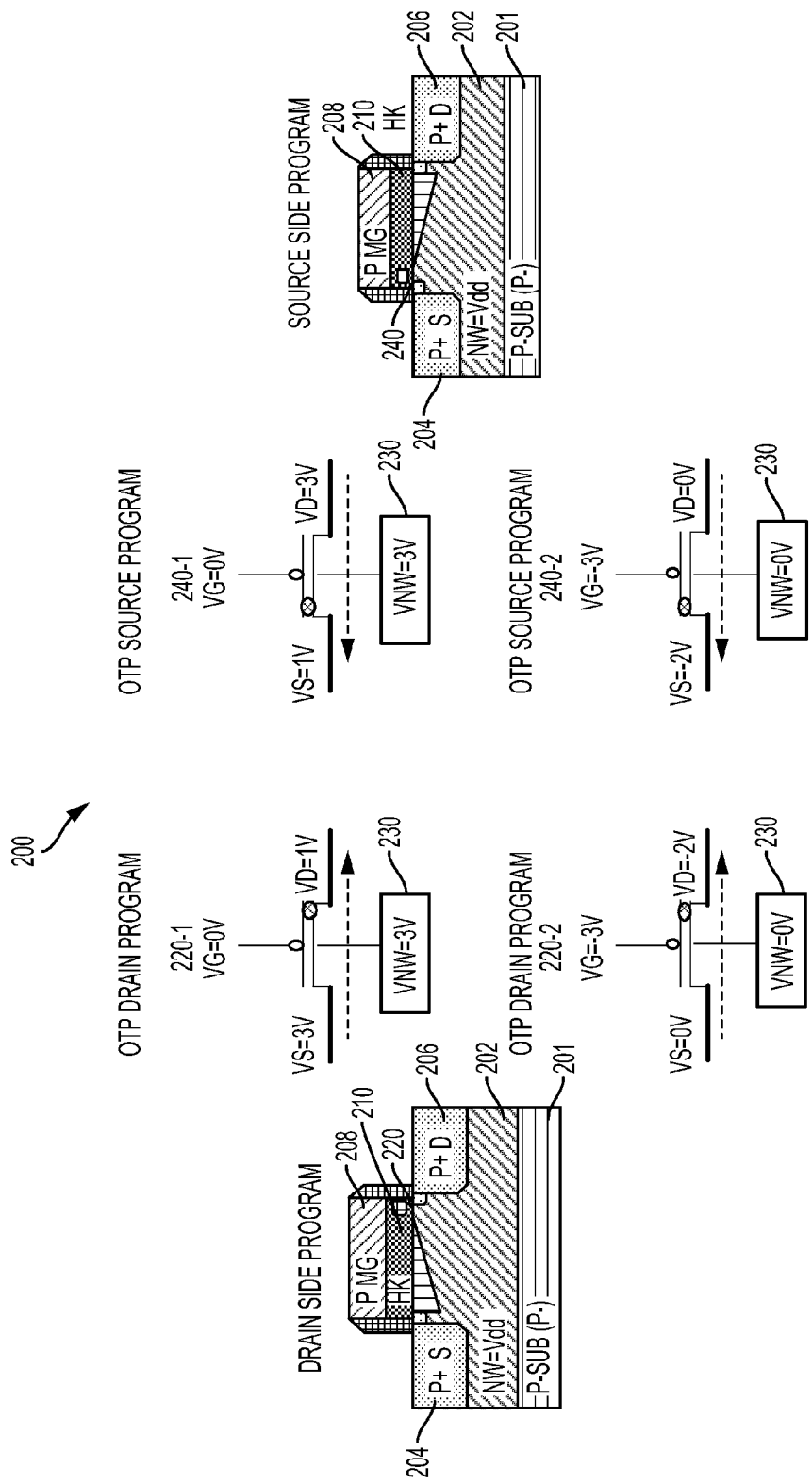
FIGS. 2A and 2B are circuit diagrams illustrating programming of a selected p-type pull-up device to provide asymmetric left and right p-type pull-up devices with mismatched p-type threshold voltages according to aspects of the present disclosure.

FIG. 2A is a circuit diagram 200 illustrating programming of a selected p-type pull-up device to provide asymmetric left and right p-type pull-up devices with mismatched p-type threshold voltages according to aspects of the present disclosure. The selected p-type pull-up device may include a substrate 201 supporting an n-well 202 supporting a source 204 and a drain 206. The selected p-type pull-up device also includes a high-K dielectric 210 supporting a gate (MG) 208. In this aspect of the disclosure, an OTP drain programming 220 (e.g., 220-1 and 220-2) is performed to permanently alter a threshold voltage of the selected p-type pull-up device. Alternatively, an OTP source programming 240 (e.g., 240-1 and 240-2) is performed to permanently alter a threshold voltage of the selected p-type pull-up device. In this aspect of the disclosure, a switch 230 (e.g., a peripheral switching circuit) is coupled to the n-well 202 to alter the n-well voltage to permanently alter a threshold voltage of the selected p-type pull-up device. This option for permanently altering the threshold voltage of the selected p-type pull-up device is further illustrated in FIGS. 3A and 3B and Table I.

Figure 2B:
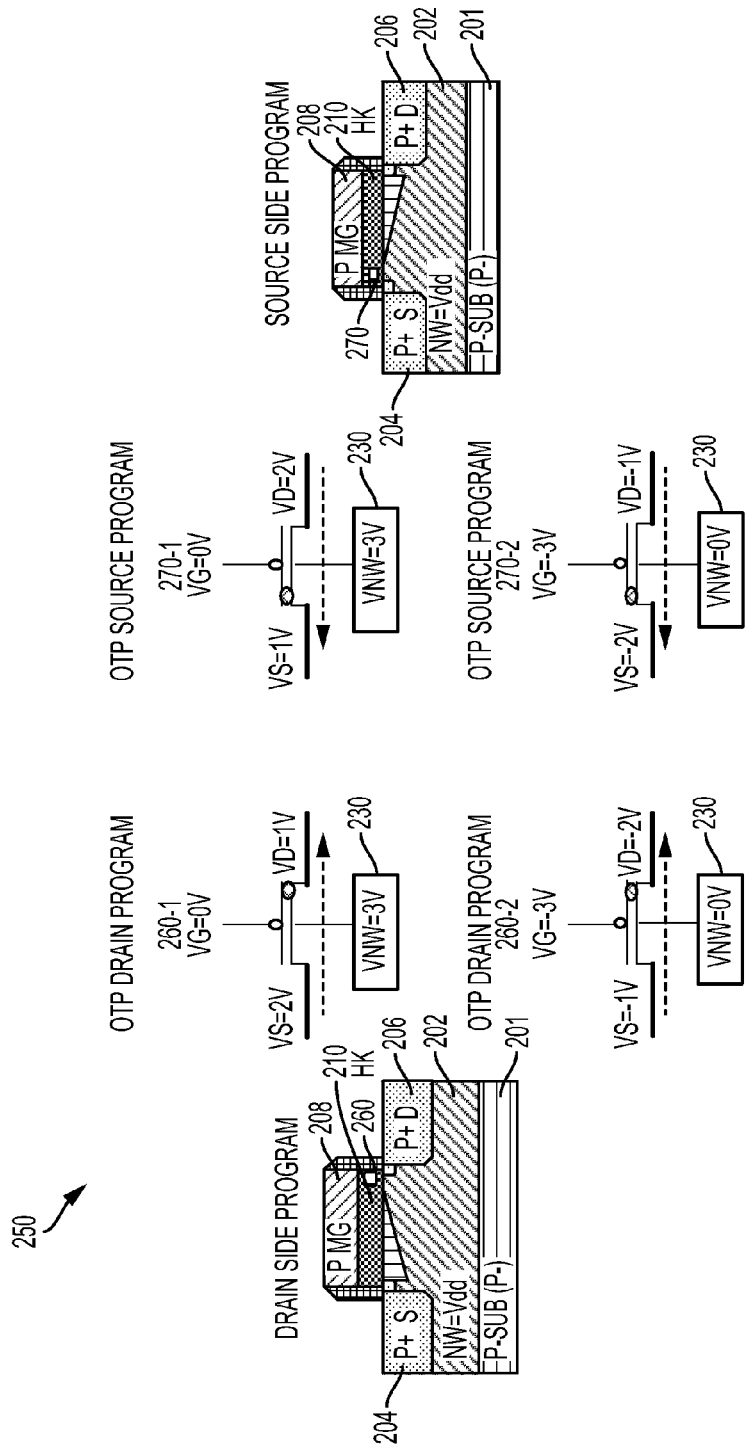

FIG. 2B is a circuit diagram 250 illustrating programming of a selected p-type pull-up device to provide asymmetric left and right p-type pull-up devices with mismatched p-type threshold voltages according to aspects of the present disclosure. The selected p-type pull-up device may be the right pull-up device 140 that is asymmetric relative to the left pull-up device 120 because the devices have mismatched p-type threshold voltages. In this aspect of the disclosure, an OTP drain side programming 260 (e.g., 260-1 and 260-2) is performed to permanently alter a threshold voltage of the selected p-type pull-up device. For example, performing OTP drain side programming 260 (e.g., Vgs=0~-3V, Vd=0, Vs=-0.6~-1.4V, Vsb=0V) provides an increase of the drain side threshold voltage. Alternatively, an OTP source programming 270 (e.g., 270-1 and 270-2) is performed to permanently alter a threshold voltage of the selected p-type pull-up device. For example, performing OTP source side programming 270 (e.g., Vgs=0~-3V, Vd=-0.6~-1.4V, Vs=0, Vsb=0V) provides an increase of the source side threshold voltage. This option for permanently altering the threshold voltage of the selected p-type pull-up device is further illustrated in FIGS. 4A and 4B and Table I.

FIG. 3A is a circuit diagram 300 of the asymmetric memory cell 100 for programming a zero state and presetting the asymmetric memory cell 100 for OTP operation in accordance with aspects of the present disclosure. Representatively, the asymmetric memory cell 100 is preset to the zero state (e.g., "0" "1") by setting the program voltage Vdd, the word line 106, the n-well voltage 122 of the left pull-up device 120, the n-well voltage 142 of the right pull-up device 140 and the bit line bar 104 to one volt (1V). In addition, the steady state voltage Vss and the bit line 102 are set to zero volts (0V) to program the zero state, such that the left branch inverter 110 stores a zero value ("0") and the right branch inverter 130 stores a one value ("1").

FIG. 3B is a circuit diagram 350 illustrating programming of the asymmetric memory cell 100 to permanently alter the threshold voltage of a selected p-type pull-up device for OTP operation in accordance with aspects of the present disclosure. Representatively, the asymmetric memory cell 100 is programmed to an OTP zero state (e.g., "0" "1") by setting the program voltage Vdd, the n-well voltage 122 of the left pull-up device 120, the n-well voltage 142 of the right pull-up device 140, the steady state voltage Vss and the bit line 102 to zero volts (0V). In addition, the word line 106 and the bit line bar 104 are set to three volts (3V) to program the OTP zero state. The threshold voltage mismatch between the left pull-up device 120 and the right pull-up device 140 results in a threshold voltage shift (e.g., Vt shift=300 mV) as well as a threshold voltage mismatch (e.g., VtMM=300 mV). The threshold voltage shift as well as a threshold voltage mismatch enable the asymmetric memory cell 100 to retain the OTP data during operation according to a non-volatile state.

Figures 4A, 4B:
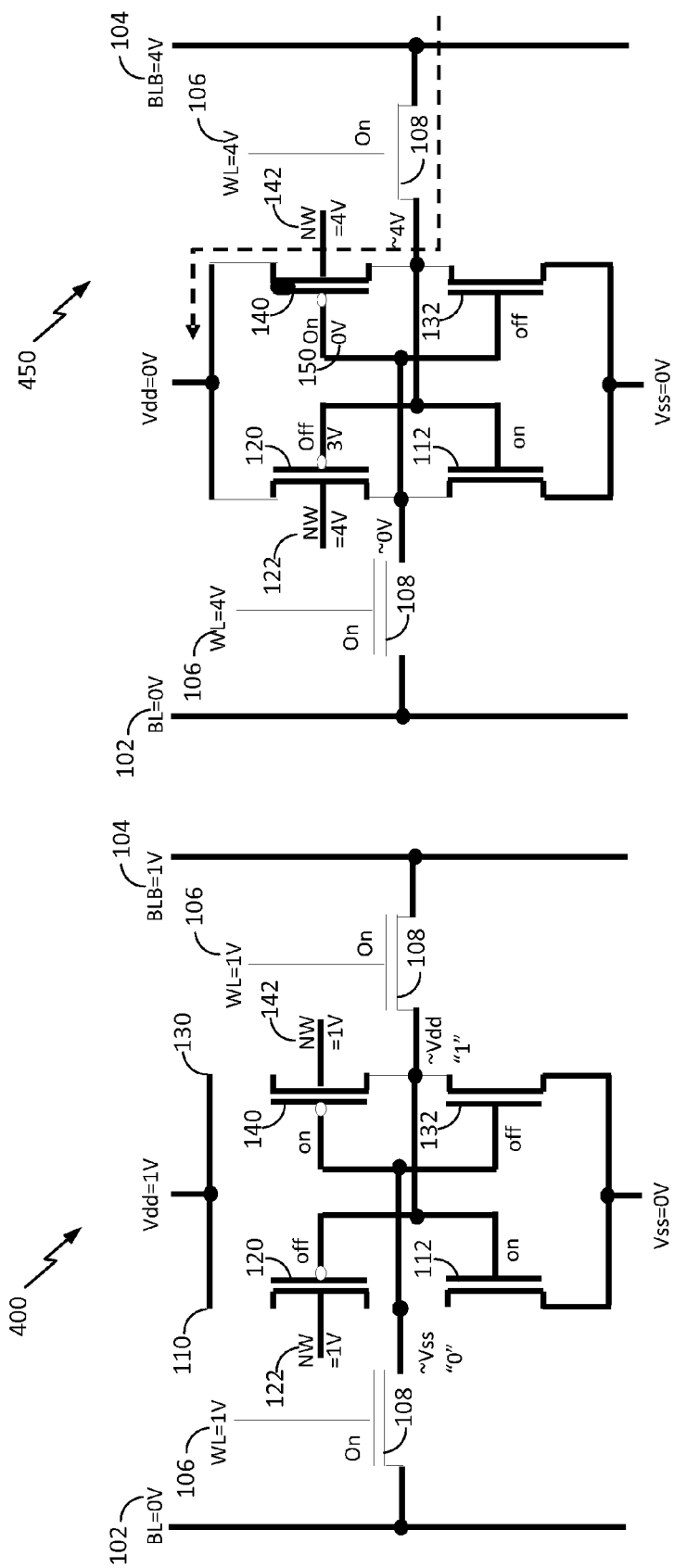
FIG. 4A is a circuit diagram of an asymmetric memory cell for programming an OTP zero state and presetting the asymmetric memory cell for OTP operation in accordance with aspects of the present disclosure.
FIG. 4B is a circuit diagram illustrating programming of an asymmetric memory cell to permanently alter the threshold voltage of a selected pull-up device for OTP operation in accordance with aspects of the present disclosure.

FIG. 4A is a circuit diagram 400 of the asymmetric memory cell 100 for programming an OTP zero state and presetting the asymmetric memory cell 100 for OTP operation in accordance with aspects of the present disclosure. Representatively, the asymmetric memory cell 100 is preset to the zero state (e.g., "0" "1") by setting the program voltage Vdd, the word line 106, the n-well voltage 122 of the left pull-up device 120, the n-well voltage 142 of the right pull-up device 140 and the bit line bar 104 to one volt (1V). In addition, the steady state voltage Vss and the bit line 102 are set to zero volts (0V) to program the zero state, such that the left branch inverter 110 stores a zero value ("0") and the right branch inverter 130 stores a one value ("1").

FIG. 4B is a circuit diagram 450 illustrating programming of the asymmetric memory cell 100 to permanently alter the threshold voltage of a selected p-type pull-up device for OTP operation in accordance with aspects of the present disclosure. Representatively, the asymmetric memory cell 100 is programmed to an OTP zero state (e.g., "0" "1") by setting the program voltage Vdd, the steady state voltage Vss and the bit line 102 to zero volts (0V). In addition, the word line 106, the n-well voltage 122 of the left pull-up device 120, the n-well voltage 142 of the right pull-up device 140 and the bit line bar 104 are set to four volts (4V) to program the OTP zero state. The threshold voltage mismatch between the left pull-up device 120 and the right pull-up device 140 results in a threshold voltage shift (e.g., Vt shift=300 mV) as well as a threshold voltage mismatch (e.g., VtMM=300 mV). The threshold voltage shift as well as a threshold voltage mismatch enable the asymmetric memory cell 100 to retain the OTP data during operation according to a non-volatile state.

FIG. 5A is a circuit diagram 500 of the asymmetric memory cell 100 for programming an OTP zero state and presetting an OTP one state read operation of the asymmetric memory cell 100 in accordance with aspects of the present disclosure. Presetting of the asymmetric memory cell 100 may be performed as shown in FIG. 4A.

FIG. 5B is a circuit diagram 550 illustrating reading of an OTP one state from the asymmetric memory cell 100 in accordance with aspects of the present disclosure. Representatively, the asymmetric memory cell 100 is programmed to an OTP zero state (e.g., "0" "1") by setting the program voltage Vdd, the word line 106, the n-well voltage 122 of the left pull-up device 120 and the n-well voltage 142 of the right pull-up device 140 to one volt (1V). In addition, the steady state voltage Vss is set to zero volts (0V) to program the OTP zero state. The threshold voltage mismatch due to the right pull-up device 140 results in a threshold voltage shift (e.g., Vt shift=300 mV) as well as a threshold voltage mismatch (e.g., VtMM=300 mV). The threshold voltage shift as well as a threshold voltage mismatch load an OTP one state (e.g., "1" "0") within the asymmetric memory cell 100 when the program voltage Vdd is applied for the read operation.

Figures 6A, 6B:
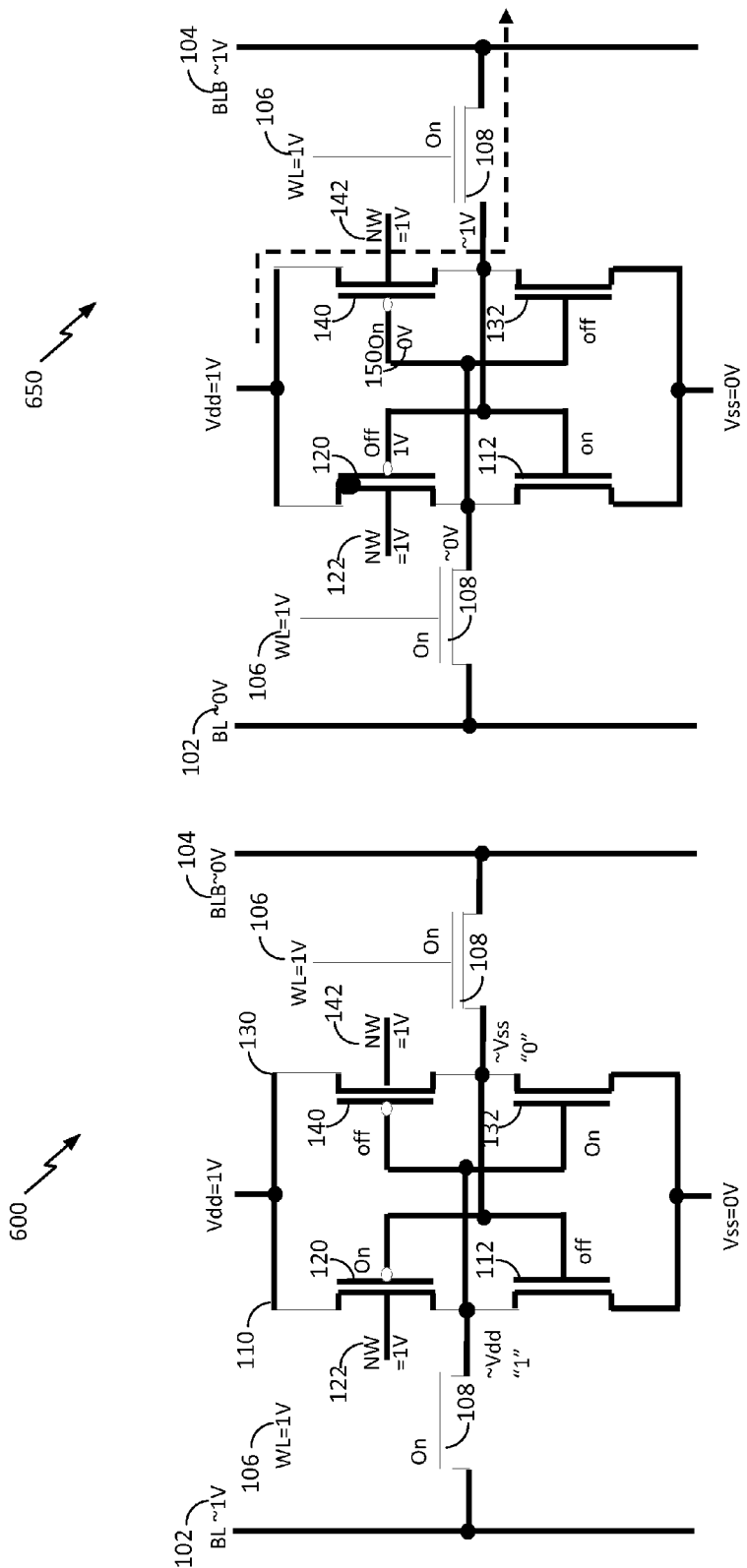
FIG. 6A is a circuit diagram of an asymmetric memory cell for programming a one state and presetting an OTP zero state read operation of the asymmetric memory cell in accordance with aspects of the present disclosure.
FIG. 6B is a circuit diagram illustrating reading of an OTP zero state from an asymmetric memory cell in accordance with aspects of the present disclosure.

FIG. 6A is a circuit diagram 600 of the asymmetric memory cell 100 for programming a one state and presetting an OTP zero state read operation of the asymmetric memory cell 100 in accordance with aspects of the present disclosure. Representatively, the asymmetric memory cell 100 is preset to the one state (e.g., "1" "0") by setting the program voltage Vdd, the word line 106, the n-well voltage 122 of the left pull-up device 120 and the n-well voltage 142 of the right pull-up device 140 to one volt (1V). In addition, the steady state voltage Vss is set to zero volts (0V) to program the one state, such that the left branch inverter 110 stores a one value ("1") and the right branch inverter 130 stores a zero value ("0"). In this aspect of the disclosure, the state can change, for example, from the one state to the zero state.

FIG. 6B is a circuit diagram 650 illustrating reading of an OTP zero state from the asymmetric memory cell 100 in accordance with aspects of the present disclosure. Representatively, the asymmetric memory cell 100 is programmed to an OTP one state (e.g., "1" "0") by setting the program voltage Vdd, the word line 106, the n-well voltage 122 of the left pull-up device 120 and the n-well voltage 142 of the right pull-up device 140 to one volt (1V). In addition, the steady state voltage Vss is set to zero volts (0V) to program the OTP one state. The threshold voltage mismatch due to the left pull-up device 120 results in a threshold voltage shift (e.g., Vt shift=300 mV) as well as a threshold voltage mismatch (e.g., VtMM=300 mV).

In aspects of the present disclosure, the threshold voltage shift as well as the threshold voltage mismatch load an OTP zero state (e.g., "0" "1") within the asymmetric memory cell 100 when the program voltage Vdd is applied for the read operation. The threshold voltage mismatch enables the asymmetric memory cell 100 to load the MTP zero state after a reduction of the power supply voltage (e.g., Vdip) is applied during operation according to an OTP non-volatile state.

TABLE I

SRAM/OTP Read and Write Operation (PU OTP)

| Operation | WL (V) | BL (V) | BLB (V) | NW (V) | Vdd (V) |
|---|---|---|---|---|---|
| Write (0) Preset | 1.0 | 0 | 1.0 | 1.0 | 1 |
| Write (0) | 3.0~4.0 | 0 | 3.0~4.0 | 0.0 | 0 |
| Write (1) Preset | 1.0 | 1.0 | 0 | 1.0 | 0 |
| Write (1) | 3.0~4.0 | 3.0~4.0 | 0 | 0.0 | 0 |
| Vdip load OTP data | 0 | NA | NA | Vdip < Vdd | Vdip < Vdd |
| Read Pre W (0) | 1.0 | 0 | 1.0 | 1.0 | 1 |
| Read | 1.0 | SA (0) or SA (1) | | 1.0 | 1 |
| Read PreW (1) | 1.0 | 1.0 | 0 | 1.0 | 1 |
| Read | 1.0 | SA (0) or SA (1) | | 1.0 | 1 |
| Read out | | SA (0) or SA (1) | | | |

Table I summarizes exemplary voltage values to perform the operations shown in FIGS. 3A to 6B. The voltage values for the word line 106, the bit line 102, the bit line bar 104, the n-well voltage 122 of the left pull-up device 120 and the n-well voltage 142 of the right pull-up device 140 and the program voltage are shown. Using the noted values, write preset operations and write operations as well as read preset and read operations are performed.

FIG. 7A is a circuit diagram 700 of the asymmetric memory cell 100 for programming a zero state and presetting the asymmetric memory cell 100 to program a pull down device threshold voltage mismatch for a multi time program (MTP) operation in accordance with aspects of the present disclosure. Representatively, the asymmetric memory cell 100 is preset to the zero state (e.g., "0" "1") by setting the program voltage Vdd, the word line 106, the n-well voltage 122 of the left pull-up device 120, the n-well voltage 142 of the right pull-up device 140 and the bit line bar 104 to one volt (1V). In addition, the steady state voltage Vss and the bit line 102 are set to zero volts (0V) to program the zero state, such that the left branch inverter 110 stores a zero value ("0") and the right branch inverter 130 stores a one value ("1").

FIG. 7B is a circuit diagram 750 illustrating programming of the asymmetric memory cell 100 to permanently alter the threshold voltage of a selected p-type pull down device for MTP operation in accordance with aspects of the present disclosure. Representatively, the asymmetric memory cell 100 is programmed to an MTP zero state (e.g., "0" "1") by setting the program voltage Vdd, the n-well voltage 122 of the left pull-up device 120, the n-well voltage 142 of the right pull-up device 140 and the bit line bar 104 are set to three volts (3V). Additionally, the steady state voltage Vss and the bit line 102 are set to zero volts (0V). The word line 106 is set to one volt (1V) to program the MTP zero state. The threshold voltage mismatch between the left pull-down device 112 and the right pull-down device 132 due to the left pull-down device 112 results in a threshold voltage mismatch (e.g., VtMM=100 mV). The threshold voltage mismatch enables the asymmetric memory cell 100 to retain the MTP data during operation according to an OTP operation mode.

FIG. 8A is a circuit diagram 800 of the asymmetric memory cell 100 for programming a zero state and presetting an MTP one state read operation for the asymmetric memory cell 100 in accordance with aspects of the present disclosure. Representatively, the asymmetric memory cell 100 is preset to the zero state (e.g., "0" "1") by setting the program voltage Vdd, the word line 106, the n-well voltage 122 of the left pull-up device 120 and the n-well voltage 142 of the right pull-up device 140 to one volt (1V). In addition, the steady state voltage Vss is set to zero volts (0V) to program the zero state, such that the left branch inverter 110 stores a zero value ("0") and the right branch inverter 130 stores a one value ("1"). In this aspect of the disclosure, the state can change, for example, from the zero state to a one state for the MTP cell read operation.

FIG. 8B is a circuit diagram 850 illustrating an MTP one state cell read operation of the asymmetric memory cell 100 in accordance with aspects of the present disclosure. Representatively, the asymmetric memory cell 100 is programmed to an MTP zero state (e.g., "0" "1") by setting the program voltage Vdd, the n-well voltage 122 of the left pull-up device 120, the n-well voltage 142 of the right pull-up device 140 and the bit line 102 are set to three volts (3V). Also, the steady state voltage Vss and the bit line bar 104 are set to zero volts (0V). In addition, the word line 106 is set to one volt (1V) to program the MTP zero state. The threshold voltage mismatch between the left pull-down device 112 and the right pull-down device 132 due to the left pull-down device 112 results in a threshold voltage mismatch (e.g., VtMM=100 mV). The threshold voltage mismatch enables the asymmetric memory cell 100 to load the MTP data after a reduced power supply voltage (Vdip) is applied during operation according to an MTP operation mode.

Figures 9A, 9B:
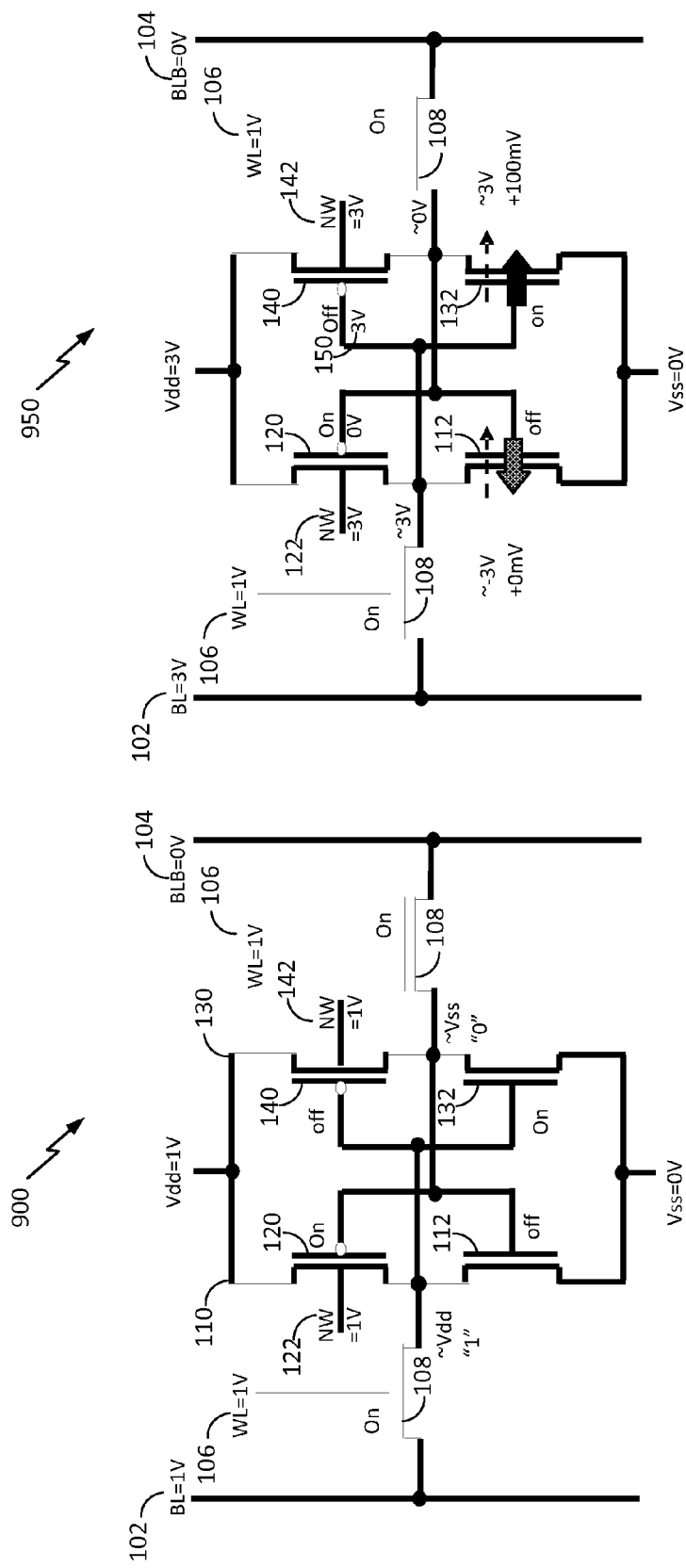
FIG. 9A is a circuit diagram of an asymmetric memory cell for programming a one state and presetting the asymmetric memory cell for MTP operation in accordance with aspects of the present disclosure.
FIG. 9B is a circuit diagram illustrating programming of an asymmetric memory cell to permanently alter the threshold voltage of a selected pull down device for MTP operation in accordance with aspects of the present disclosure.

FIG. 9A is a circuit diagram 900 of the asymmetric memory cell 100 for programming a one state and presetting the asymmetric memory cell 100 for MTP operation in accordance with aspects of the present disclosure. Representatively, the asymmetric memory cell 100 is preset to the one state (e.g., "1" "0") by setting the program voltage Vdd, the bit line 102, the word line 106, the n-well voltage 122 of the left pull-up device 120 and the n-well voltage 142 of the right pull-up device 140 to one volt (1V). In addition, the steady state voltage Vss and the bit line bar 104 are set to zero volts (0V) to program the one state, such that the left branch inverter 110 stores a one value ("1") and the right branch inverter 130 stores a zero value ("0").

FIG. 9B is a circuit diagram 950 illustrating programming of the asymmetric memory cell 100 to permanently alter the threshold voltage of a selected p-type pull down device for MTP operation in accordance with aspects of the present disclosure. Representatively, the asymmetric memory cell 100 is programmed to an MTP one state (e.g., "1" "0") by setting the program voltage Vdd, the n-well voltage 122 of the left pull-up device 120, the n-well voltage 142 of the right pull-up device 140 and the bit line 102 to three volts (3V). Also, the steady state voltage Vss and the bit line bar 104 are set to zero volts (0V). In addition, the word line 106 is set to one volt (1V) to program the MTP one state. The threshold voltage mismatch between the left pull-down device 112 and the right pull-down device 132 due to the right pull-down device 132 results in a threshold voltage mismatch (e.g., VtMM=100 mV). The threshold voltage mismatch enables the asymmetric memory cell 100 to retain the MTP data during operation according to an MTP non-volatile state.

Figures 10A, 10B:
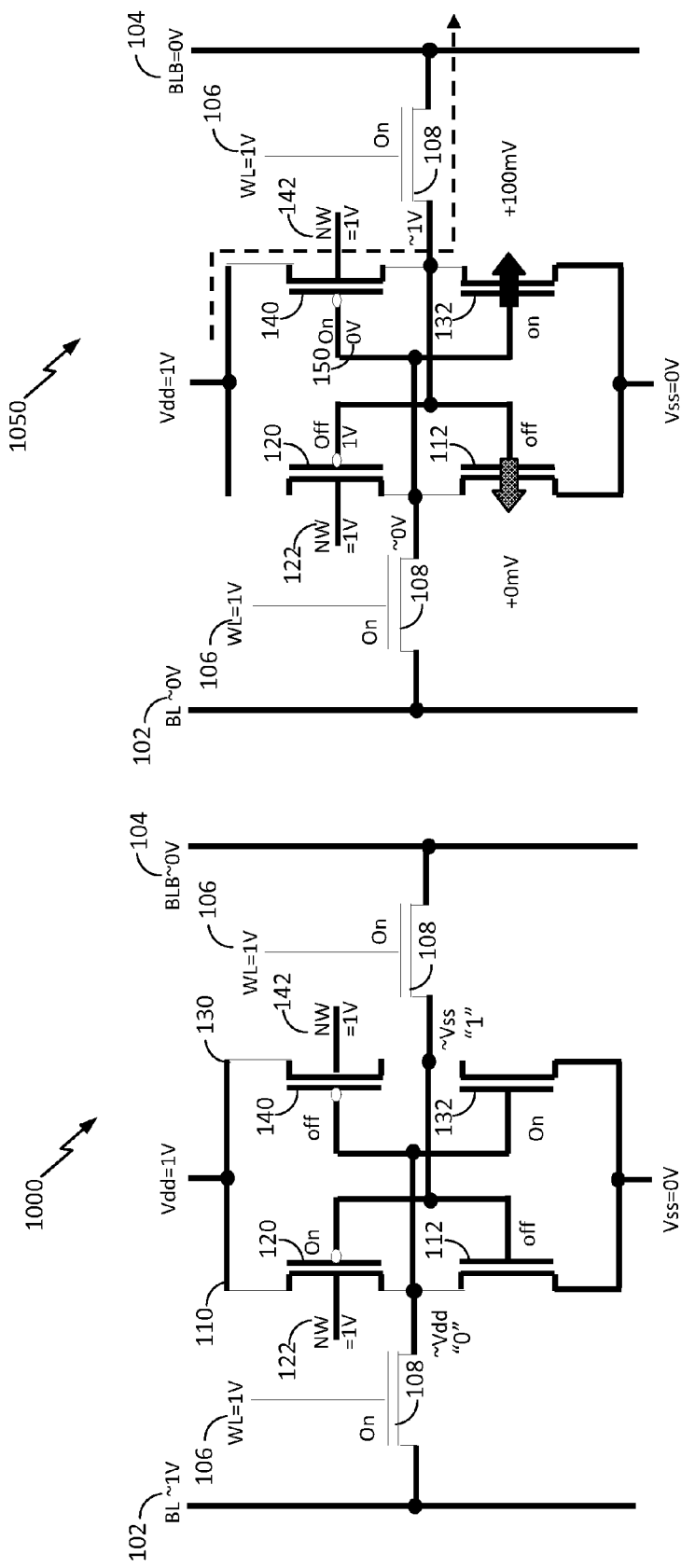
FIG. 10A is a circuit diagram of an asymmetric memory cell for programming a one state and presetting an MTP zero state read operation for the asymmetric memory cell in accordance with aspects of the present disclosure.
FIG. 10B is a circuit diagram illustrating an MTP zero state read operation of an asymmetric memory cell in accordance with aspects of the present disclosure.

FIG. 10A is a circuit diagram 1000 of the asymmetric memory cell 100 for programming a one state and presetting an MTP zero state read operation for the asymmetric memory cell 100 in accordance with aspects of the present disclosure. Representatively, the asymmetric memory cell 100 is preset to the one state (e.g., "1" "0") by setting the program voltage Vdd, the word line 106, the n-well voltage 122 of the left pull-up device 120 and the n-well voltage 142 of the right pull-up device 140 to one volt (1V). In addition, the steady state voltage Vss is set to zero volts (0V) to program the one state, such that the left branch inverter 110 stores a zero value ("0") and the right branch inverter 130 stores a one value ("1"). In this aspect of the disclosure, the state can change, for example, from the zero state to a one state for the MTP cell read operation.

FIG. 10B is a circuit diagram 1050 illustrating an MTP zero state read operation of the asymmetric memory cell 100 in accordance with aspects of the present disclosure. Representatively, the asymmetric memory cell 100 is programmed to an MTP one state (e.g., "1" "0") by setting the program voltage Vdd, the n-well voltage 122 of the left pull-up device 120, the n-well voltage 142 of the right pull-up device 140 and the bit line 102 to one volt (1V). Also, the steady state voltage Vss and the bit line bar 104 are set to zero volts (0V). In addition, the word line 106 is set to one volt (1V) to program the MTP zero state. The threshold voltage mismatch between the left pull-down device 112 and the right pull-down device 132 due to the right pull-down device 132 results in a threshold voltage mismatch (e.g., VtMM=100 mV). The threshold voltage mismatch enables the asymmetric memory cell 100 to load the MTP zero state after the reduced power supply voltage Vdip is applied during operation according to an MTP operation mode.

Figure 11:
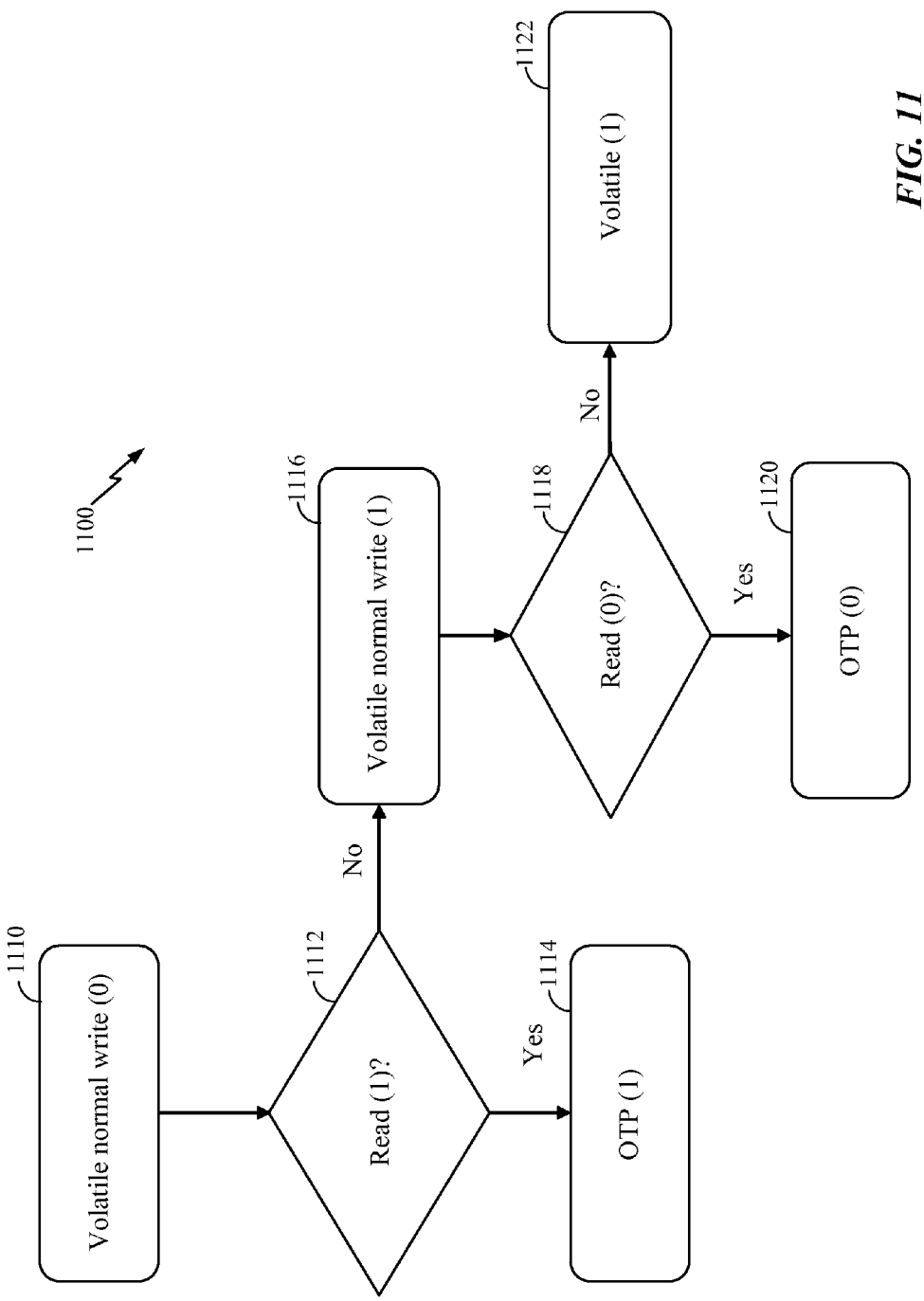
FIG. 11 is a flow diagram illustrating a method for determining a state of a volatile and one-time program (OTP) compatible memory cell according to aspects of the disclosure.

FIG. 11 is a flow diagram illustrating a method 1100 for determining a state of a volatile and one-time program (OTP) compatible memory cell according to aspects of the disclosure. At block 1110, a normal write operation is performed to a memory cell (e.g., a zero state ("0" "1")). The voltage is lowered to a weak voltage, for example to 0.2V, then increased to Vdd. The data is not lost during this transition. At block 1112, it is determined whether a state read for the memory cell (e.g., the asymmetric memory cell 100) is a one state ("1" "0").

When the state read for the memory cell is the one state, the state of the memory cell is identified as an OTP state at block 1114. When the state read for the memory cell is the zero state, another write operation is performed to the memory cell (e.g., the one state) at block 1116. The voltage is then lowered to the weak voltage. At block 1118, it is determined whether the state read for the memory cell is the zero state. When the state read for the memory cell is the zero state, the state of the memory cell is identified as an OTP state at block 1120. When the state read from the memory cell is the one state, the state of the memory cell is identified as a volatile state at block 1122.

Figure 12:
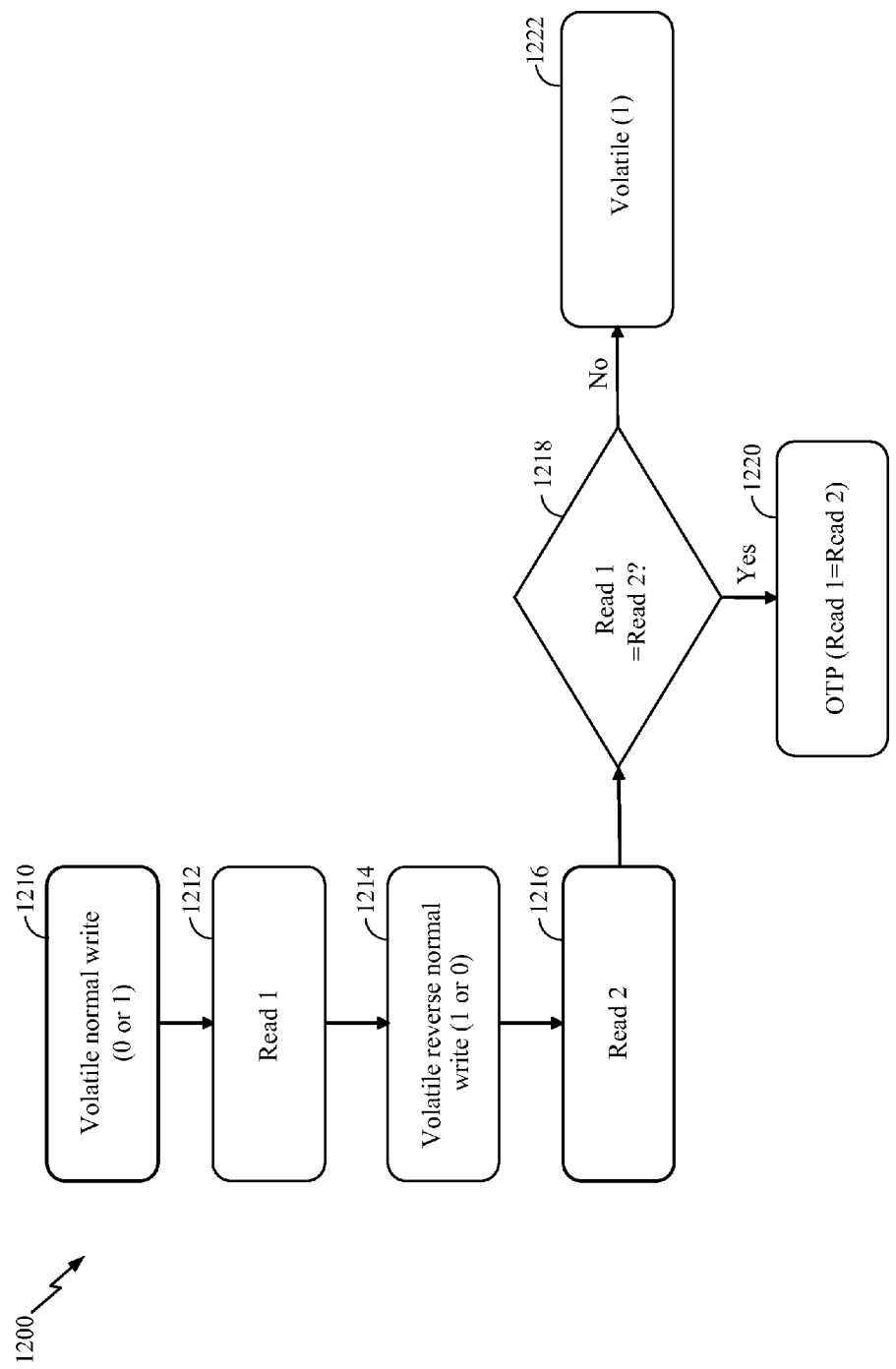
FIG. 12 is a flow diagram illustrating a method for determining state of a volatile and OTP compatible memory cell according to aspects of the disclosure.

FIG. 12 is a flow diagram illustrating a method 1200 for determining a state of a volatile and one-time program (OTP) compatible memory cell according to aspects of the disclosure. At block 1210, a normal write operation is performed to the memory cell (e.g., the zero state or the one state). The voltage is lowered and then at block 1212, a first read operation is performed to determine a first read state of the memory cell. At block 1214, a reverse normal write operation from the normal write operation of block 1210 is performed to the memory cell (e.g., the OTP one state or the OTP zero state).

The voltage is again lowered and then at block 1216, a second read operation is performed to determine a second read state of the memory cell. At block 1218, it is determined whether the first read state (e.g., Read 1) matches the second read state (e.g., Read 2). When the first read state (e.g., Read 1) matches the second read state (e.g., Read 2), the state of the memory cell is identified as an OTP state at block 1220. When the first read state (e.g., Read 1) does not match the second read state (e.g., Read 2), the state of the memory cell is identified as the volatile state at block 1222.

Figure 13:
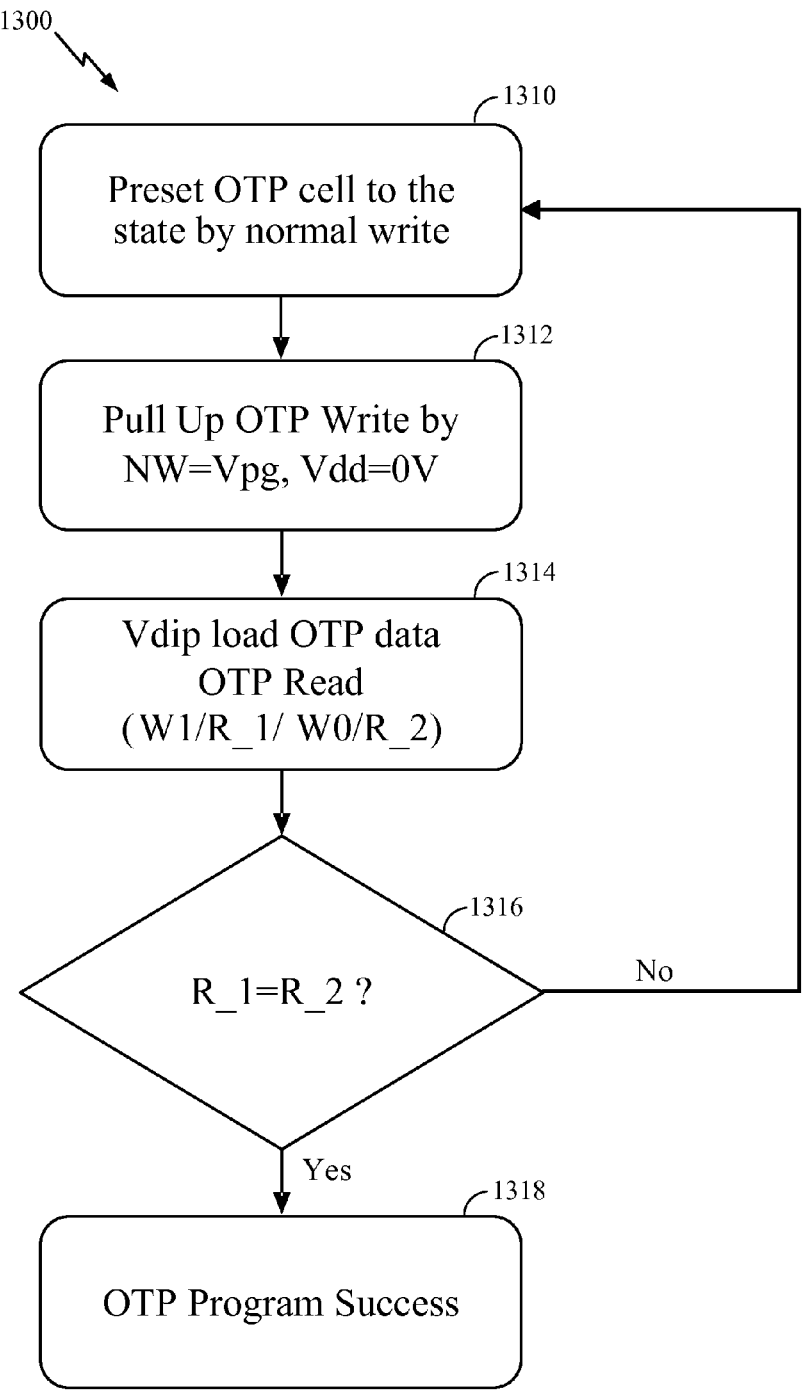
FIG. 13 is a flow diagram illustrating a method for one-time program (OTP) programming of a volatile and one-time program (OTP) compatible memory cell according to aspects of the disclosure.

FIG. 13 is a flow diagram illustrating a method 1300 for a volatile and one-time program (OTP) compatible memory cell according to aspects of the disclosure. At block 1310, a normal write operation is performed to the memory cell (e.g., the zero state or the one state). For example, as shown in FIG. 1C, the asymmetric memory cell 100 is preset to the one state (e.g., "1" "0"). At block 1312, one-time programming (OTP) of the memory cell is performed by writing an OTP state to the memory cell as well as setting an n-well voltage (NW) to a program voltage (Vpg) and setting a power supply voltage to zero (e.g., Vdd=0). For example, as shown in FIG. 1C, the asymmetric memory cell 100 is programmed to an OTP one state by setting the n-well voltage 142 of the left pull-up device 120 and the right pull-up device 140 to an program voltage (e.g., Vpg=3V) using a switch (e.g., switch 230 of FIGS. 2A and 2B) while the power supply voltage is set to zero (e.g., Vdd=0).

Referring again to FIG. 13, at block 1314, a reduced power supply voltage (e.g., Vdip) is applied that is sufficient to store OTP data, for example, as shown in FIG. 1B. Any volatile data within the asymmetric cell is lost when the reduced power supply voltage Vdip is applied. In addition, a first normal write operation (W1) is performed to the memory cell, and a first read operation is performed to determine a first read value (R_1)). The first and second read operations may involve increasing the power supply voltage from Vdip to Vdd. Additionally, a second normal write operation (W2) is performed to the memory cell, and a second read operation is performed to determine a second read state (R_2) of the memory cell. At block 1316, it is determined whether the first read state (R_1) matches the second read state (R_2). When the first read state (R_1) matches the second read state (R_2), the state of the memory cell is identified as being successfully OTP programmed at block 1318. When the first read state (R_1) does not match the second read state (R_2), blocks 1310 to 1316 are repeated until the memory cell is successfully OTP programmed. That is, blocks 1310 to 1316 are repeated when a stored OTP state within the asymmetric memory cell does not match the first read state (R_1) or the second read state (R_2).

In one configuration, a volatile and one-time program (OTP) compatible memory cell includes means for means for controlling programming of the asymmetric memory cell. The volatile and OTP compatible memory cell also includes means for programming a reduced power supply voltage (Vdip) of the asymmetric memory cell for an OTP operation mode during a program mode. The volatile and OTP compatible memory cell also includes means for means for programming the power supply voltage to Vdd of the asymmetric memory cell for volatile operation mode. In one aspect of the disclosure, the program control means is the switch 230 of FIGS. 2A and 2B, configured to perform the functions recited by the program control means. In another aspect, the aforementioned means may be a device or circuit configured to perform the functions recited by the aforementioned means.

Figure 14:
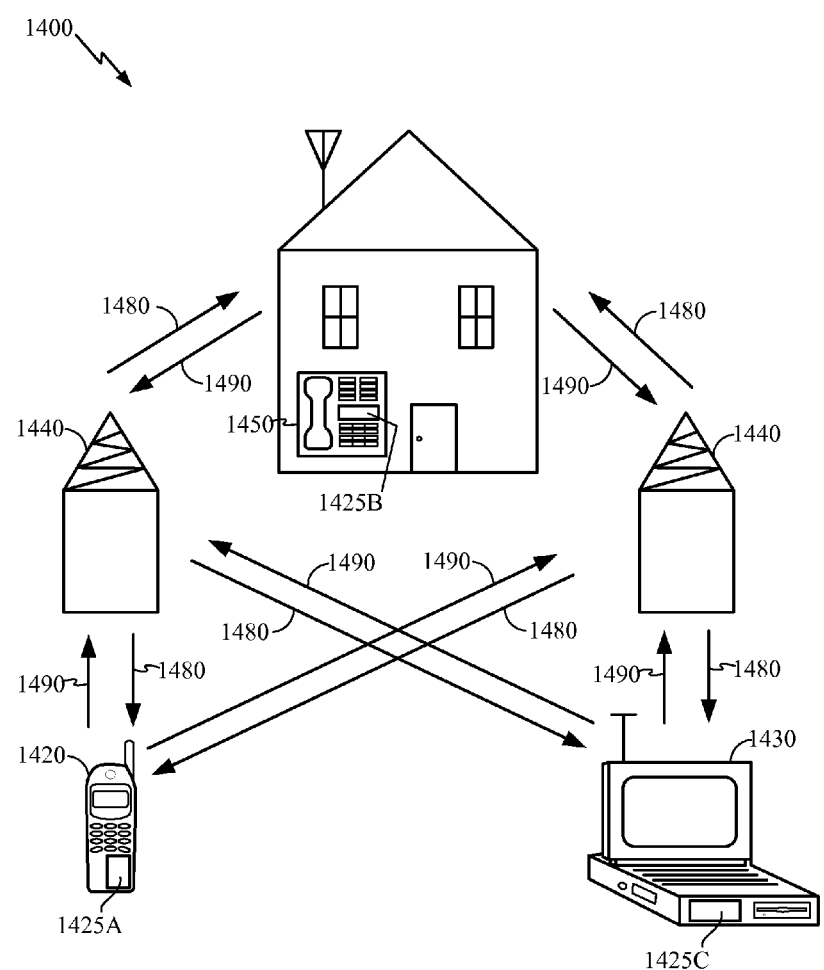
FIG. 14 is a block diagram showing a wireless communication system in which a configuration of the disclosure may be advantageously employed.

FIG. 14 is a block diagram showing an exemplary wireless communication system 1400 in which a configuration of the disclosure may be advantageously employed. For purposes of illustration, FIG. 14 shows three remote units 1420, 1430, and 1450 and two base stations 1440. It will be recognized that wireless communication systems may have many more remote units and base stations. Remote units 1420, 1430, and 1450 include IC devices 1425A, 1425B, and 1425C, which include the disclosed volatile and one-time program (OTP) compatible memory cells. It will be recognized that any device containing an IC may also include the disclosed volatile and OTP compatible memory cells, including the base stations, switching devices, and network equipment. FIG. 14 shows forward link signals 1480 from the base station 1440 to the remote units 1420, 1430, and 1450 and reverse link signals 1490 from the remote units 1420, 1430, and 1450 to base stations 1440.

In FIG. 14, remote unit 1420 is shown as a mobile telephone, remote unit 1430 is shown as a portable computer, and remote unit 1450 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as a meter reading equipment, or any other device that stores or retrieves data or computer instructions, or any combination thereof. Although FIG. 14 illustrates IC devices 1425A, 1425B, and 1425C, which include the disclosed volatile and OTP compatible memory cells, the disclosure is not limited to these exemplary illustrated units. Aspects of the present disclosure may be suitably employed in any device, which includes the volatile and OTP compatible memory cells.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, non-volatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "a step for."

What is claimed is:

1. A volatile and one-time program (OTP) compatible asymmetric memory cell, comprising:
   a first pull-up transistor having a first threshold voltage;
   a second pull-up transistor having a second threshold voltage that differs from the first threshold voltage;
   a switch coupled to a well of the first pull-up transistor and the second pull-up transistor to alternate between a program voltage (Vpg) and a power supply voltage; and
   a peripheral switching circuit to control programming of the asymmetric memory cell in a OTP operation mode during a program mode.

2. The asymmetric memory cell of claim 1, in which the peripheral switching circuit is configured to program a reduced power supply voltage (Vdip) of the asymmetric memory cell for the OTP operation mode during the program mode.

3. The asymmetric memory cell of claim 1, in which the peripheral switching circuit is further configured to program the power supply voltage to Vdd of the asymmetric memory cell for volatile operation mode.

4. The asymmetric memory cell of claim 1 integrated into a mobile phone, a set top box, a music player, a video player, an entertainment unit, a navigation device, a computer, a hand-held personal communication systems (PCS) unit, a portable data unit, and/or a fixed location data unit.

5. A method for a volatile and one-time program (OTP) compatible asymmetric memory cell, comprising:
   writing a zero state or a one state to the asymmetric memory cell;
   setting a well of a first pull-up device and a second pull-up device of the asymmetric memory cell to a program voltage (Vpg) and setting a power supply voltage to zero to permanently alter a threshold voltage of a selected one of the first pull-up device and the second pull-up device; and
   applying a reduced power supply voltage (Vdip) to load an OTP state within the asymmetric memory cell.

6. The method of claim 5, further comprising:
   reading a stored OTP state within the asymmetric memory cell; and reprogramming the asymmetric memory cell to store the OTP state when the stored OTP state does not match the OTP state.

7. The method of claim 6, in which reading the stored OTP state comprises:
increasing the power supply voltage from zero to Vdd; and
reading the stored OTP state from the asymmetric memory cell.

8. The method of claim 5, further comprising:
increasing the power supply voltage from zero to Vdd; and
operating the asymmetric memory cell according to a volatile operation mode.

9. The method of claim 5, in which data within the asymmetric memory cell is deleted when applying the reduced power supply voltage (Vdip) to load the OTP state.

10. The method of claim 5, further comprising integrating the asymmetric memory cell into a mobile phone, a set top box, a music player, a video player, an entertainment unit, a navigation device, a computer, a hand-held personal communication systems (PCS) unit, a portable data unit, and/or a fixed location data unit.

11. A volatile and one-time program (OTP) compatible asymmetric memory cell, comprising:
a first pull-up transistor having a first threshold voltage;
a second pull-up transistor having a second threshold voltage that differs from the first threshold voltage;
a switch coupled to a well of the first pull-up transistor and the second pull-up transistor to alternate between a program voltage (Vpg) and a power supply voltage; and
means for controlling programming of the asymmetric memory cell in a OTP operation mode during a program mode.

12. The asymmetric memory cell of claim 11, further comprising means for programming a reduced power supply voltage (Vdip) of the asymmetric memory cell for the OTP operation mode during the program mode.

13. The asymmetric memory cell of claim 11, further comprising means for programming the power supply voltage to Vdd of the asymmetric memory cell for volatile operation mode.

14. The asymmetric memory cell of claim 11 integrated into a mobile phone, a set top box, a music player, a video player, an entertainment unit, a navigation device, a computer, a hand-held personal communication systems (PCS) unit, a portable data unit, and/or a fixed location data unit.

15. A method for a volatile and one-time program (OTP) compatible asymmetric memory cell, comprising:
a step for writing a zero state or a one state to the asymmetric memory cell;
a step for setting a well of a first pull-up device and a second pull-up device of the asymmetric memory cell to a program voltage (Vpg) and setting a power supply voltage to zero to permanently alter a threshold voltage of a selected one of the first pull-up device and the second pull-up device; and
a step for applying a reduced power supply voltage (Vdip) to load an OTP state within the asymmetric memory cell.

16. The method of claim 15, further comprising:
a step for reading a stored OTP state within the asymmetric memory cell; and
a step for reprogramming the asymmetric memory cell to store the OTP state when the stored OTP state does not match the OTP state.

17. The method of claim 16, in which reading the stored OTP state comprises:
a step for increasing the power supply voltage from zero to Vdd; and
a step for reading the stored OTP state from the asymmetric memory cell.

18. The method of claim 15, further comprising:
a step for increasing the power supply voltage from zero to Vdd; and
a step for operating the asymmetric memory cell according to a volatile operation mode.

19. The method of claim 15, in which volatile data within the asymmetric memory cell is deleted when applying the reduced power supply voltage (Vdip) to load the OTP state.

20. The method of claim 15, further comprising a step for integrating the asymmetric memory cell into a mobile phone, a set top box, a music player, a video player, an entertainment unit, a navigation device, a computer, a hand-held personal communication systems (PCS) unit, a portable data unit, and/or a fixed location data unit.

* * * * *